(12) United States Patent
Jacob et al.

(10) Patent No.: US 9,478,663 B2
(45) Date of Patent: Oct. 25, 2016

(54) FINFET DEVICE INCLUDING A UNIFORM SILICON ALLOY FIN

(71) Applicant: GLOBALFOUNDRIES Inc., Grand Cayman (KY)

(72) Inventors: Ajey Poovannummoottil Jacob, Watervliet, NY (US); Jody A. Fronheiser, Delmar, NY (US); Yi Qi, Niskayuna, NY (US); Sylvie Mignot, Slingerlands, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/526,617

(22) Filed: Oct. 29, 2014

(65) Prior Publication Data

US 2016/0126353 A1 May 5, 2016

(51) Int. Cl.
| | |
|---|---|
| *H01L 21/336* | (2006.01) |
| *H01L 21/3205* | (2006.01) |
| *H01L 29/78* | (2006.01) |
| *H01L 29/66* | (2006.01) |
| *H01L 21/324* | (2006.01) |
| *H01L 21/18* | (2006.01) |
| H01L 29/165 | (2006.01) |
| H01L 21/02 | (2006.01) |

(52) U.S. Cl.
CPC ..... *H01L 29/7851* (2013.01); *H01L 21/02164* (2013.01); *H01L 21/18* (2013.01); *H01L 21/324* (2013.01); *H01L 29/66795* (2013.01); *H01L 29/7842* (2013.01); *H01L 21/0243* (2013.01); *H01L 21/02381* (2013.01); *H01L 21/02532* (2013.01); *H01L 29/165* (2013.01)

(58) Field of Classification Search
CPC .............. H01L 21/02164; H01L 21/02532; H01L 21/2254; H01L 21/324
See application file for complete search history.

(56) References Cited

U.S. PATENT DOCUMENTS

| | | | |
|---|---|---|---|
| 2011/0012090 A1* | 1/2011 | Singh .................... | B82Y 10/00 257/24 |
| 2014/0097518 A1* | 4/2014 | Cheng ................. | H01L 27/0886 257/618 |
| 2014/0361336 A1* | 12/2014 | Chen ..................... | H01L 29/785 257/190 |
| 2015/0137193 A1* | 5/2015 | Cheng ................. | H01L 29/7842 257/288 |
| 2015/0144998 A1* | 5/2015 | Ching ................... | H01L 29/785 257/190 |
| 2015/0318216 A1* | 11/2015 | Cheng ............... | H01L 21/82382 438/221 |

* cited by examiner

*Primary Examiner* — Long K Tran
(74) *Attorney, Agent, or Firm* — Amerson Law Firm, PLLC

(57) ABSTRACT

A method includes forming a fin on a semiconductor substrate and forming recesses on sidewalls of the fin. A silicon alloy material is formed in the recesses. A thermal process is performed to define a silicon alloy fin portion from the silicon alloy material and the fin. A semiconductor device includes a substrate, a fin defined on the substrate and an isolation structure disposed adjacent the fin. A first portion of the fin extending above the isolation structure has a substantially vertical sidewall and a different material composition than a second portion of the fin not extending above the isolation structure.

20 Claims, 6 Drawing Sheets

FINFET DEVICE INCLUDING A UNIFORM SILICON ALLOY FIN

BACKGROUND OF THE INVENTION

1. Field of the Invention

The present disclosure generally relates to the fabrication of semiconductor devices, and, more particularly, to a finFET device including a uniform silicon alloy fin and methods for making same.

2. Description of the Related Art

In modern integrated circuits, such as microprocessors, storage devices and the like, a very large number of circuit elements, especially transistors, are provided and operated on a restricted chip area. In integrated circuits fabricated using metal-oxide-semiconductor (MOS) technology, field effect transistors (FETs) (both NMOS and PMOS transistors) are provided that are typically operated in a switching mode. That is, these transistor devices exhibit a highly conductive state (on-state) and a high impedance state (off-state). FETs may take a variety of forms and configurations. For example, among other configurations, FETs may be either so-called planar FET devices or three-dimensional (3D) devices, such as FinFET devices.

A field effect transistor (FET), irrespective of whether an NMOS transistor or a PMOS transistor is considered, and irrespective of whether it is a planar or 3D FinFET device, typically comprises doped source/drain regions that are formed in a semiconductor substrate that are separated by a channel region. A gate insulation layer is positioned above the channel region and a conductive gate electrode is positioned above the gate insulation layer. The gate insulation layer and the gate electrode may sometimes be referred to as the gate structure for the device. By applying an appropriate voltage to the gate electrode, the channel region becomes conductive and current is allowed to flow from the source region to the drain region. In a planar FET device, the gate structure is formed above a substantially planar upper surface of the substrate. In some cases, one or more epitaxial growth processes are performed to form epitaxial (epi) semiconductor material in recesses formed in the source/drain regions of the planar FET device. In some cases, the epi material may be formed in the source/drain regions without forming any recesses in the substrate for a planar FET device, or the recesses may be overfilled, thus forming raised source/drain regions. The gate structures for such planar FET devices may be manufactured using so-called "gate-first" or "replacement gate" (gate-last) manufacturing techniques.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation distance between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. FIG. 1A is a perspective view of an illustrative prior art FinFET semiconductor device 100 that is formed above a semiconductor substrate 105. In this example, the FinFET device 100 includes three illustrative fins 110, a gate structure 115, sidewall spacers 120 and a gate cap 125. The gate structure 115 is typically comprised of a layer of insulating material (not separately shown), e.g., a layer of high-k insulating material or silicon dioxide, and one or more conductive material layers (e.g., metal and/or polysilicon) that serve as the gate electrode for the device 100. The fins 110 have a three-dimensional configuration. The portions of the fins 110 covered by the gate structure 115 is the channel region of the FinFET device 100. An isolation structure 130 is formed between the fins 110.

To improve carrier mobility, it is useful to use materials in the fin that are different from the base silicon of the substrate 105. For example, silicon-germanium is a useful fin material. Fabricating SiGe fin portions introduces difficulties associated with a difference in the thermal gradients of Si and SiGe. Also, annealing processes for isolation structures on the device exposes SiGe to an oxygen atmosphere that consumes some of the silicon-germanium. One solution is to clad the fin with SiGe after the isolation structure anneal and recess; however, cladding silicon at this step does not provide a uniform film growth and thus a uniform channel, since the film is faceted.

FIG. 1B illustrates a cross-sectional view depicting the formation of epi semiconductor material, such as silicon-germanium, on various fins across the substrate 105, including fins for the finFET device 100. This cladding may be performed prior to forming the gate structure 115 if the alloy is desired in the channel region, after forming the gate structure 115 if the alloy is only desired in the source/drain regions, or after forming a dummy gate structure for a replacement gate process flow. The fins 110 shown in FIG. 1A are densely-spaced fins. Additional isolated fins 135 are illustrated representing a different region of the substrate 105. For example, the densely-spaced fins 110 may be part of a logic device or SRAM NFET, while the isolated fins 135 may be part of an SRAM PFET. During the epi material growth process, the growth starts in the direction of a (111) crystallographic plane of the substrate 105. In the case of the densely spaced fins 110, the epi regions can grow between the fins 110 and merge to form a substantially horizontal surface. Further growth from the horizontal surface occurs in a direction corresponding to a (100) plane of the substrate. Growth occurs much faster in a (100) plane as compared to a (111) plane, thus resulting in a merged epi structure 140 above the densely-spaced fins 110 and discrete faceted epi structures 145 above the isolated fins 135.

In cases where the alloy is present in the channel region, the non-uniform profile can alter the operating characteristics of the gate structure. In the case of the source/drain regions, the merged epi structure 140 can have different device characteristics as compared to a device with the discrete epi structure 145. For example, the resistance of the device may be higher for the device with the merged epi structure 140. Conductive contact structures will eventually be formed to the source/drain regions of the device. Due to the higher topology of the merged epi structure 140, the contact etches terminate differently, and the contact structures have different sizes. This size difference results in a difference in resistance. In addition, the fins 110 may be associated with separate devices (e.g., an N-channel device and a P-channel device), and the merged epi structure 140 may cause a short circuit between the fins 110 of the separate devices, which may destroy their functionality.

The present disclosure is directed to various methods and resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming semiconductor devices. A method includes forming a fin on a semiconductor substrate and forming recesses on sidewalls of the fin. A silicon alloy material is formed in the recesses. A thermal process is performed to define a silicon alloy fin portion from the silicon alloy material and the fin.

Another method includes forming a fin on a semiconductor substrate and forming recesses on sidewalls of the fin. A silicon-germanium material is formed in the recesses. A thermal process is performed to define a silicon-germanium fin portion from the silicon-germanium material and the fin. The silicon-germanium fin portion has a substantially vertical profile.

One illustrative semiconductor device includes, among other things, a substrate, a fin defined on the substrate, and an isolation structure disposed adjacent the fin. A first portion of the fin extending above the isolation structure has a substantially vertical sidewall and a different material composition than a second portion of the fin not extending above the isolation structure.

BRIEF DESCRIPTION OF THE DRAWINGS

The disclosure may be understood by reference to the following description taken in conjunction with the accompanying drawings, in which like reference numerals identify like elements, and in which.

Figure 1A:
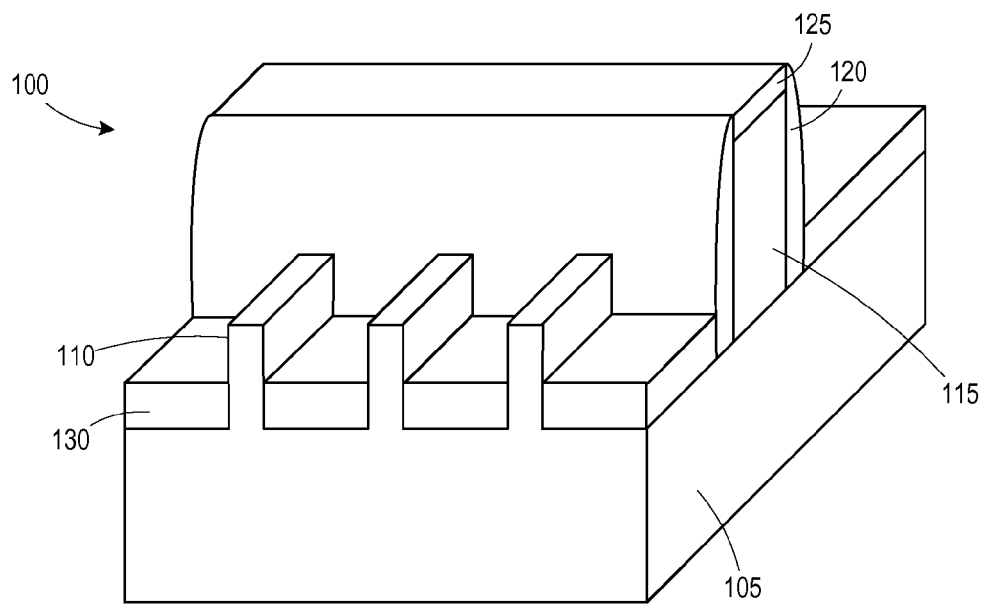
FIGS. 1A-1B schematically depict an illustrative prior art finFET device.
Figure 1B:
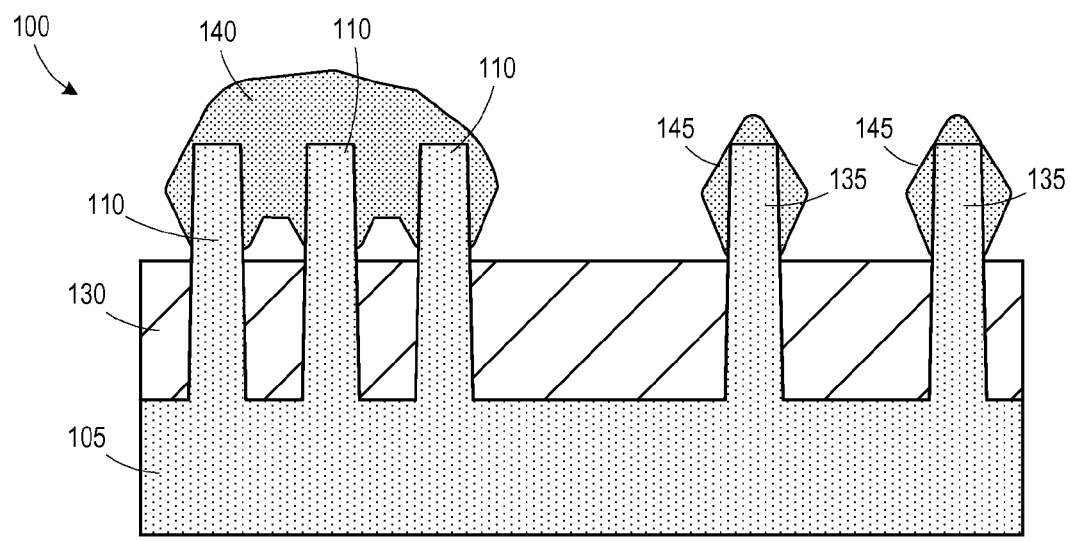

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming a finFET device with a uniform silicon alloy fin. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

FIGS. 2A-2E illustrate various methods for forming a finFET device 200. FIGS. 2A-2E show a cross-sectional view (in the gate width direction of the device 200) of a substrate 205 with a fin 210 defined thereon. A hard mask layer 215 remains on the fin 210 after an etch process was performed to define the fin 210 in the substrate 205. An isolation structure 218 is defined adjacent the fin 210 to separate the fin 210 from adjacent fins (not shown). The substrate 205 may have a variety of configurations, such as the depicted bulk silicon configuration. The substrate 205 may also have a silicon-on-insulator (SOI) configuration that includes a bulk silicon layer, a buried insulation layer and an active layer, wherein semiconductor devices are formed in and above the active layer. The substrate 205 may be formed of silicon or silicon-germanium or it may be made of materials other than silicon, such as germanium. Thus, the terms "substrate" or "semiconductor substrate" should be understood to cover all semiconducting materials and all forms of such materials. The substrate 205 may have different layers. For example, the fin 210 may be formed in a process layer formed above a base layer of the substrate 205.

Figure 2A:
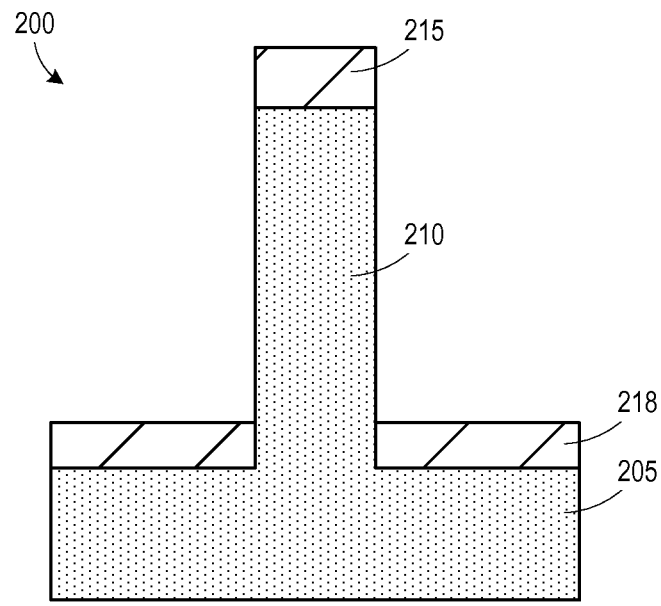
FIGS. 2A-2E depict various methods disclosed herein of forming a finFET device.
Figure 2B:
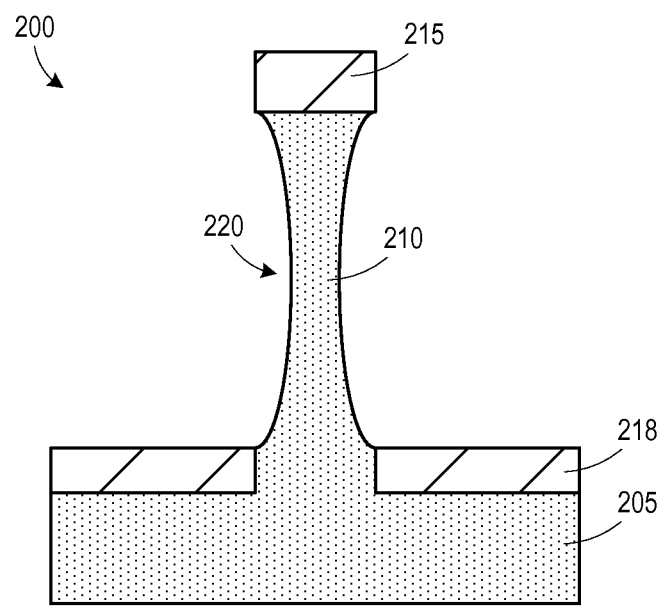

FIG. 2B illustrates the device 200 after an etch process is performed to undercut the hard mask layer 215 and define recessed sidewalls 220 on the fin 210. The etch process may be a continuation of the etch process used to define the fin 210, or it may be an additional etch process. The etch process may include an isotropic component or the etch process may employ a tilt angle with an anisotropic etch component to cause the undercutting of the hard mask layer 215 and the formation of the recessed sidewalls 220.

Figure 2C:
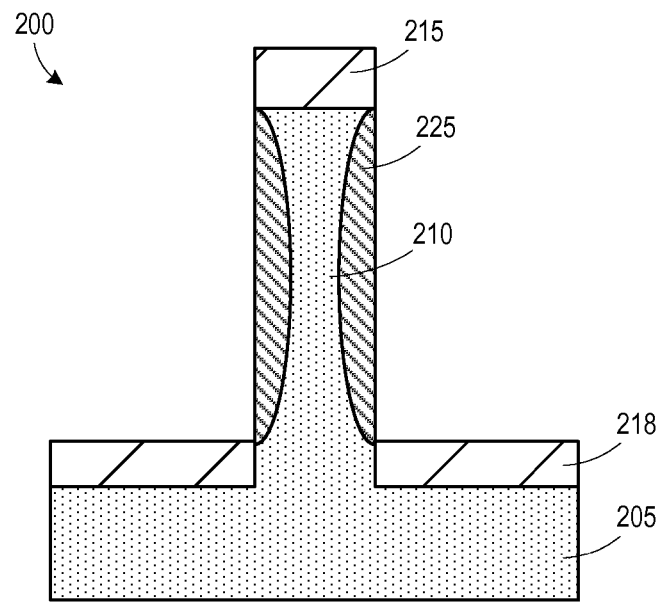

FIG. 2C illustrates the device 200 after an epitaxial growth process is performed to clad the fin 210 with a silicon alloy material 225, such as silicon-germanium. For purposes of the following examples, it is assumed that the alloy material is germanium. Due to the recessed sidewalls 220, the growth of the silicon alloy material 225 occurs substantially in the recesses and is timed to terminate when the recesses are filled, resulting in a uniform (i.e., substantially vertical) sidewall profile for the fin 210 combined with the silicon alloy material 225. The silicon alloy material 225 has a strained state when grown due to the lattice mismatch between the material of the fin 210 and the silicon alloy material 225.

Figure 2D:
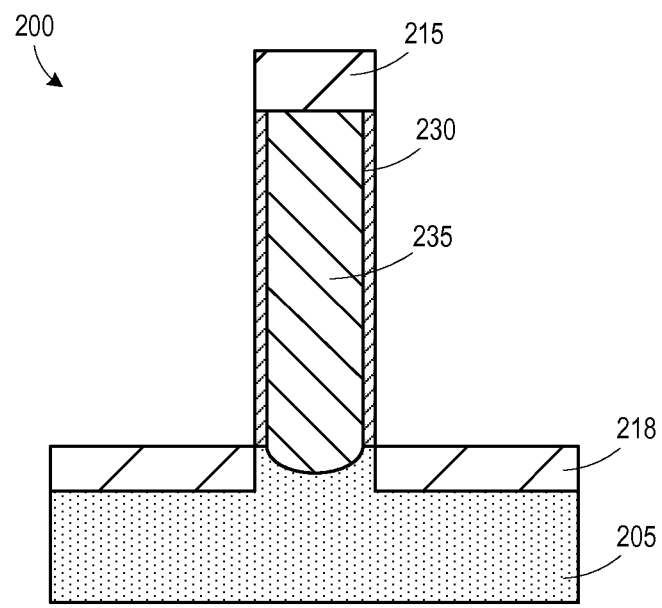
Figure 2E:
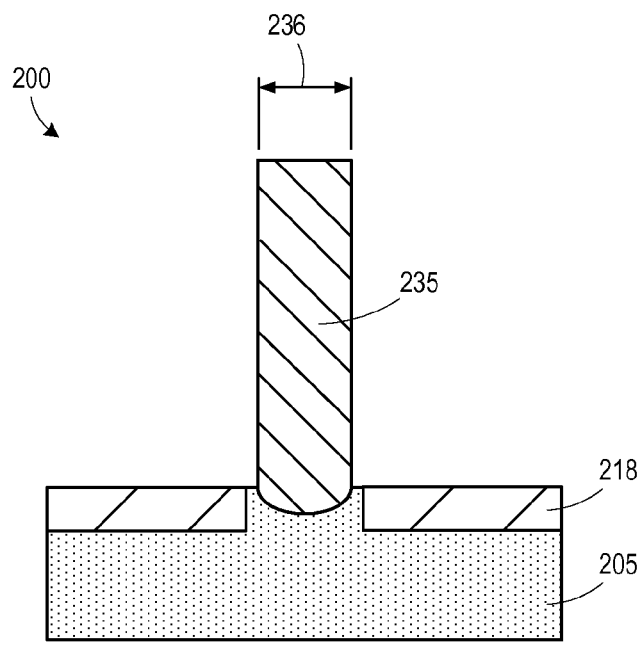

FIG. 2D illustrates the device 200 after a thermal process, such as a condensation process, is performed. During the condensation process, an oxygen-containing ambient is provided and the substrate is heated to approximately 600-1100° C. The particular temperature employed depends on the time required to be used for uniformly diffusing germanium. So the time-temperature window has to be optimized. The oxygen in the ambient reacts with silicon in the fin 210 and the silicon alloy material 225, causing silicon dioxide to form and precipitate out to form a silicon dioxide layer 230 on an outer surface of the fin 210. The germanium in the silicon alloy material 225 thermally mixes with the silicon in the fin 210 to define a silicon alloy fin 235. The concentration of the germanium in the silicon alloy fin 235 depends on the initial germanium concentration in the silicon alloy material 225 and the length of the condensation process. For example, the silicon alloy fin 235 may have substantially equal concentrations of silicon and germanium or the silicon alloy fin 235 may be germanium rich (i.e., the germanium concentration is higher than the silicon concentration). When the germanium concentration becomes higher than the silicon concentration after condensation, the thickness of the fin 235 is reduced. The condensation process may also be, e.g., a condensation anneal process, that serves to anneal and densify the insulating material of the isolation structure 218. FIG. 2E illustrates the device 200 after an etch process is performed to remove the silicon dioxide layer 230 and the hard mask layer 215. The silicon alloy fin 235 retains its strained state after the thermal process.

For a thermal mixing process, the fin 235 dimension remains the same before and after the thermal mixing. Also, the germanium concentration in the whole structure would be less than the initial amount. However, for condensation, the initial and final width/height of the fin 235 may not be the same.

Additional processing steps (not shown) may be performed to complete fabrication of the finFET device 200, such as the forming of a gate electrode structure and implantation steps to dope source/drain regions of the finFET device 200. Silicidation processes may be performed to form contact areas on the finFET device 200, and subsequent metallization layers and interconnect lines and vias may be formed. Other layers of material, such as a stress-inducing contact etch stop layer and the like, may be present but are not depicted in the attached drawings.

Figure 3:
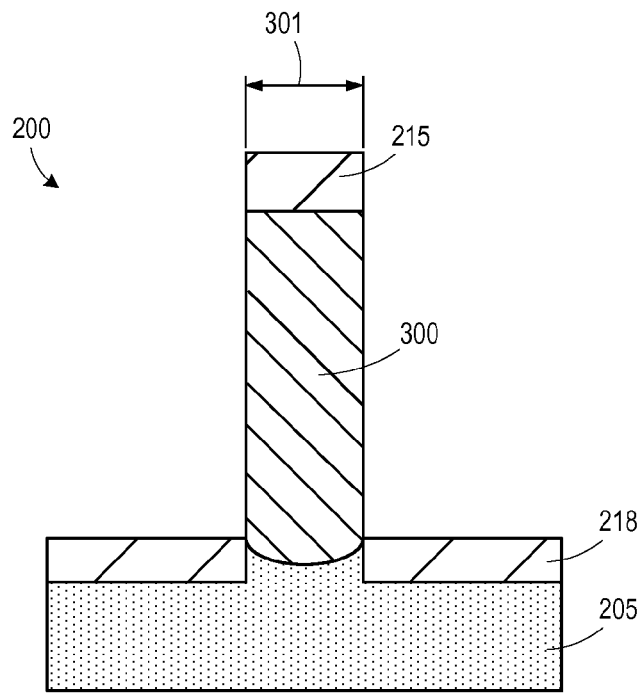
FIG. 3 depicts an alternative thermal processing technique for the flow depicted in FIGS. 2A-2E.

FIG. 3 illustrates an alternative process flow for forming a silicon alloy fin 300, where an anneal is performed to facilitate a thermal mixing process in lieu of a condensation process by performing the thermal processing in an inert ambient (e.g., nitrogen). During the thermal mixing process, the germanium in the silicon alloy material 225 mixes with the silicon in the fin 210 to define the silicon alloy fin 300.

The concentration of the germanium in the silicon alloy fin 300 depends on the initial germanium concentration in the silicon alloy material 225, as there is no precipitation of the silicon. The silicon alloy fin 300 has a slightly wider critical dimension 301 than the critical dimension 236 of the silicon alloy fin 235 because there is no silicon dioxide layer 230 formed and removed, as shown in FIGS. 2D and 2E. The silicon alloy fin 300 also retains its strained state. In some embodiments, the thermal mixing process of FIG. 3 may be followed by a condensation process. The thermal mixing process reduces the concentration gradient between the cladding silicon alloy material 225 and the fin 210 prior to the condensation process, which tends to decrease the generation of defects in the silicon alloy fin 300. The relatively high oxidation temperature for condensation also enables a reduced processing time.

FIGS. 4A-4D illustrate various alternative methods for forming a finFET device 400. FIGS. 4A-4D show a cross-sectional view (in the gate width direction of the device 400) of a substrate 405 with a fin 410 defined thereon. A hard mask layer 415 remains on the fin 410 after an etch process was performed to define the fin 410 in the substrate 405. An isolation structure 420 is defined adjacent the fin 410 to isolate the fin 410 from adjacent fins (not shown). Note that the height of the isolation structure 420 may be varied to affect the amount of the fin 410 that is exposed, and thus the height of the subsequently formed alloy fin portion.

Figure 4A:
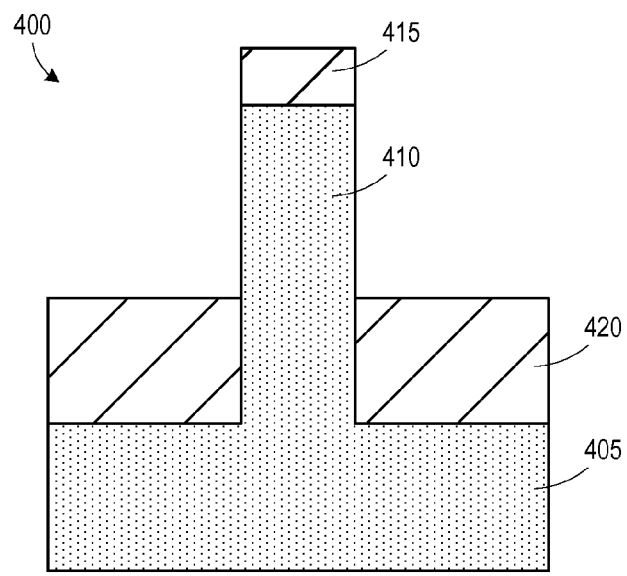
FIGS. 4A-4D illustrate various alternative methods disclosed herein for forming a finFET device.
Figure 4B:
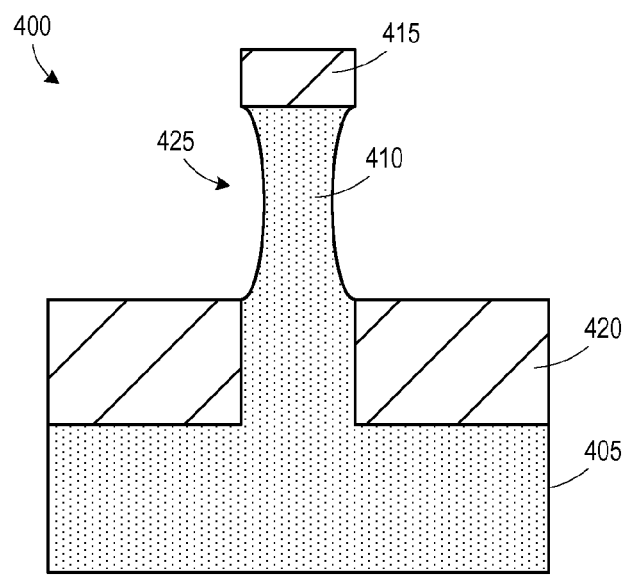

FIG. 4B illustrates the device 400 after an etch process is performed to undercut the hard mask layer 415 and define recessed sidewalls 425 on the fin 410 extending above the isolation structure 420.

Figure 4C:
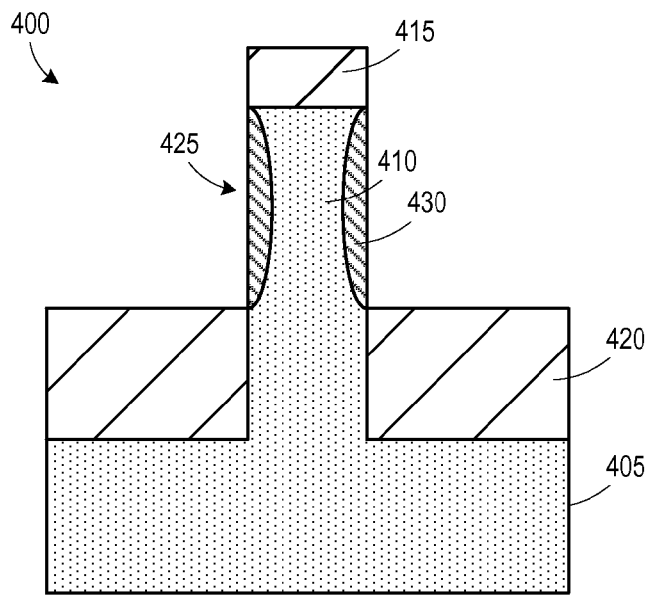

FIG. 4C illustrates the device 400 after an epitaxial growth process is performed to clad the fin 410 with a silicon alloy material 430, such as silicon-germanium. Due to the recessed sidewalls 425, the growth of the silicon alloy material 430 occurs substantially in the recesses and is timed to terminate when the recesses are filled, resulting in a uniform (i.e., substantially vertical) sidewall profile for the fin 410 combined with the silicon alloy material 430. Again, the silicon alloy material 430 is grown in a strained state due to the lattice mismatch.

Figure 4D:
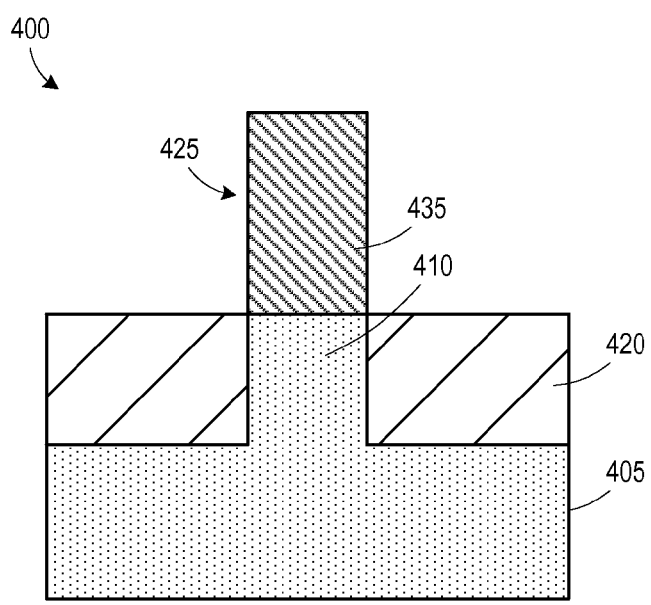

FIG. 4D illustrates the device 400 after a condensation process or thermal mixing process is performed to define a silicon alloy fin portion 435 only on the end portions of the fin 410 extending above the isolation structure 420. The silicon alloy fin portion 435 retains its strained state. Furthermore, one of the thermal mixing or condensation processes may also serve to anneal and densify the insulating material of the isolation structure 420, e.g., a thermal mixing anneal process. Additionally, an etch process is performed to remove the hard mask layer 410. Again, subsequent processing steps may be performed to complete the device 400.

The uniformity provided by the substantially vertical sidewall profiles of the silicon alloy fins 235, 300, 435 reduce pitch problems as they do not merge in dense regions. Also, the fins 235, 300, 435 are uniform in the channel regions, so they do not affect the operating characteristics of the gate electrode.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
forming a fin on a semiconductor substrate;
forming recesses on sidewalls of said fin;
epitaxially growing a silicon alloy in said recesses; and
performing a thermal process to define a silicon alloy fin portion from said silicon alloy material and said fin, wherein an alloy component in said silicon alloy component mixes with a material of said fin to provide a uniform diffusion of said alloy component in said silicon alloy fin portion.

2. The method of claim 1, wherein said silicon alloy material comprises silicon-germanium.

3. The method of claim 2, wherein a germanium concentration of said silicon-germanium is higher than a silicon concentration of said silicon-germanium.

4. The method of claim 1, further comprising:
forming an isolation structure covering a first portion of said fin; and
forming said recesses in a second portion of said fin not covered by said isolation structure.

5. The method of claim 1, wherein said thermal process comprises a condensation process.

6. The method of claim 5, wherein a silicon dioxide layer is formed on an outer surface of said silicon alloy fin portion during said condensation process, and the method further comprises removing said silicon dioxide layer.

7. The method of claim 1, wherein said thermal process comprises a thermal mixing anneal process.

8. The method of claim 1, wherein said thermal process comprises a thermal mixing anneal process and a condensation process performed after said thermal mixing anneal process.

9. The method of claim 1, wherein a hard mask layer is formed above said fin, and said recesses are formed in the presence of said hard mask layer.

10. The method of claim 1, wherein said silicon alloy fin portion has a substantially vertical sidewall profile.

11. A method, comprising:
forming a fin on a semiconductor substrate;
forming recesses on sidewalls of said fin;
epitaxially growing a silicon-germanium material in said recesses; and
performing a thermal process to define a silicon-germanium fin portion from said silicon-germanium material and said fin, wherein germanium in said silicon-germanium material mixes with a material of said fin to provide a uniform diffusion of germanium in said silicon-germanium fin portion, said silicon-germanium fin portion has a substantially vertical sidewall profile.

12. The method of claim 11, wherein a germanium concentration of said silicon-germanium is higher than a silicon concentration of said silicon-germanium.

13. The method of claim 11, further comprising:
forming an isolation structure covering a first portion of said fin; and
forming said recesses in a second portion of said fin not covered by said isolation structure.

14. The method of claim 11, wherein said thermal process comprises a condensation process.

15. The method of claim 11, wherein said thermal process comprises a thermal mixing anneal process.

16. The method of claim 11, wherein a hard mask layer is formed above said fin, and said recesses are formed in the presence of said hard mask layer.

17. A method, comprising:
forming a fin on a semiconductor substrate;
forming recesses on sidewalls of said fin;
forming a silicon alloy material in said recesses;
performing a thermal condensation process to define a silicon alloy fin portion from said silicon alloy material and said fin, wherein a silicon dioxide layer is formed on an outer surface of said silicon alloy fin portion during said thermal condensation process; and
removing said silicon dioxide layer.

18. The method of claim 17, further comprising performing a thermal mixing anneal process prior to performing said thermal condensation process.

19. The method of claim 17, further comprising:
forming an isolation structure covering a first portion of said fin; and
forming said recesses in a second portion of said fin not covered by said isolation structure.

20. The method of claim 17, wherein said silicon alloy material comprises silicon-germanium.

* * * * *